(12) United States Patent
Prasad et al.

(10) Patent No.: US 10,811,257 B2
(45) Date of Patent: Oct. 20, 2020

(54) TECHNIQUES FOR FORMING LOW STRESS ETCH-RESISTANT MASK USING IMPLANTATION

(71) Applicant: Varian Semiconductor Equipment Associates, Inc., Gloucester, MA (US)

(72) Inventors: Rajesh Prasad, Lexington, MA (US); Tzu-Yu Liu, Somerville, MA (US); Kyu-Ha Shim, Andover, MA (US); Tom Ho Wing Yu, Campbell, CA (US); Zhong Qiang Hua, Saratoga, CA (US); Adolph Miller Allen, Oakland, CA (US); Viabhav Soni, Sunnyvale, CA (US); Ravi Rajagopalan, San Jose, CA (US); Nobuyuki Sasaki, Cupertino, CA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/997,251

(22) Filed: Jun. 4, 2018

(65) Prior Publication Data

US 2019/0304783 A1  Oct. 3, 2019

Related U.S. Application Data

(60) Provisional application No. 62/648,578, filed on Mar. 27, 2018.

(51) Int. Cl.
*H01L 21/033* (2006.01)
*H01L 21/265* (2006.01)
(Continued)

(52) U.S. Cl.
CPC ...... *H01L 21/0337* (2013.01); *H01L 21/0234* (2013.01); *H01L 21/02115* (2013.01);
(Continued)

(58) Field of Classification Search
CPC ......... H01L 21/02115; H01L 21/02266; H01L 21/02321; H01L 21/02329; H01L 21/0234; H01L 21/0332; H01L 21/0337
See application file for complete search history.

(56) References Cited

U.S. PATENT DOCUMENTS

| | | | |
|---|---|---|---|
| 5,210,430 A * | 5/1993 | Taniguchi | C09K 11/65 257/103 |
| 2014/0273461 A1 * | 9/2014 | Lee | C23C 16/26 438/694 |

(Continued)

FOREIGN PATENT DOCUMENTS

DE   10224215 A1 * 12/2003   ............. C23C 16/26

OTHER PUBLICATIONS

Prawer, et al., "Effect of heavy ion irradiation on amorphous hydrogenated diamondlike) carbon films," J. Appl. Phys., vol. 61, No. 9, May 1, 1987, 4492-4500.

*Primary Examiner* — Zandra V Smith
*Assistant Examiner* — Molly K Reida (57) ABSTRACT

A method may include depositing a carbon layer on a substrate using physical vapor deposition, wherein the carbon layer exhibits compressive stress, and is characterized by a first stress value; and directing a dose of low-mass species into the carbon layer, wherein, after the directing, the carbon layer exhibits a second stress value, less compressive than the first stress value.

16 Claims, 9 Drawing Sheets

(51) Int. Cl.
*H01L 21/3115* (2006.01)
*H01L 21/02* (2006.01)

(52) U.S. Cl.
CPC .. *H01L 21/02266* (2013.01); *H01L 21/02321* (2013.01); *H01L 21/02329* (2013.01); *H01L 21/0332* (2013.01); *H01L 21/26593* (2013.01); *H01L 21/31155* (2013.01)

(56) References Cited

U.S. PATENT DOCUMENTS

| | | | |
|---|---|---|---|
| 2015/0194317 A1* | 7/2015 | Manna | H01L 21/3086 438/694 |
| 2015/0200094 A1* | 7/2015 | Underwood | C23C 14/3471 438/778 |
| 2019/0172714 A1* | 6/2019 | Bobek | H01L 21/0234 |

* cited by examiner

```
┌─────────────────────────────┐  ┌─────────────────────────────┐
│ DEPOSITING CARBON LAYER ON  │  │ DIRECTING DOSE OF LOW MASS  │
│ DEVICE STRUCTURE USING      │  │ SPECIES INTO CARBON LAYER,  │
│ PHYSICAL VAPOR DEPOSITION   │──│ WHEREIN CARBON LAYER        │
│ PROCESS, WHEREIN CARBON     │  │ ATTAINS SECOND STRESS       │
│ LAYER EXHIBITS COMPRESSIVE  │  │ VALUE, LESS COMPRESSIVE     │
│ STRESS HAVING A FIRST       │  │ THAN FIRST STRESS VALUE     │
│ STRESS VALUE                │  │ 904                         │
│ 902                         │  │                             │
└─────────────────────────────┘  └─────────────────────────────┘
```

TECHNIQUES FOR FORMING LOW STRESS ETCH-RESISTANT MASK USING IMPLANTATION

RELATED APPLICATIONS

This application claims priority to U.S. Provisional Patent application No. 62/648,578, filed Mar. 27, 2018, entitled TECHNIQUES FOR FORMING LOW STRESS ETCH-RESISTANT MASK USING IMPLANTATION, and incorporated by reference herein in its entirety.

FIELD

The present embodiments relate to device processing, and more particularly, to etch resistant sacrificial masks having improved stability.

BACKGROUND

In the present day, device fabrication, such as semiconductor device fabrication, may the use of one or multiple sacrificial mask layers, or sacrificial masks, including so-called hard masks. During patterning of devices using hardmasks, such as during three dimensional NAND memory device (3D NAND) and DRAM fabrication, a useful property of the hardmask is etch resistance to the etchant being used to etch underlying substrate features. For example, a reactive ion etching (ME) process may be used to etch oxide, nitride or metal underlying features under the hardmask, where the ME species are designed to etch the underlying features at a more rapid rate than etching of the hardmask material. This etch selectivity allows thinner hardmasks to be employed, facilitating more faithful reproduction of the hardmask pattern in underlying features. While carbon-based hardmasks have come into widespread use, one characteristic of carbon hardmasks is the stress within the hardmask. This stress may lead to unwanted effects, such as roughness of patterned hardmask features, as well as mechanical deformation of a substrate, such as bowing or line bending.

With respect to these and other considerations the present disclosure is provided.

BRIEF SUMMARY

In one embodiment, a method may include depositing a carbon layer on a substrate using physical vapor deposition, wherein the carbon layer exhibits compressive stress, and is characterized by a first stress value; and directing a dose of low-mass species into the carbon layer, wherein, after the directing, the carbon layer exhibits a second stress value, less compressive than the first stress value.

In an additional embodiment, a method to generate a low stress etch resistant mask layer may include depositing a carbon layer by physical vapor deposition, wherein the carbon layer exhibits a compressive stress, wherein a value of the compressive stress is a first stress value, and wherein the carbon layer exhibits a first density. The method may further include directing a dose of low-mass ions into the carbon layer, wherein after the directing the dose the carbon layer exhibits a second stress value, less compressive than the first stress value, and wherein the carbon layer exhibits a second density, greater than the first density.

In a further embodiment, a method to generate a low stress etch resistant mask layer, may include depositing a carbon layer by physical vapor deposition, wherein the carbon layer exhibits a compressive stress, wherein a value of the compressive stress is a first stress value, and wherein the carbon layer exhibits a first density. The method may include directing a dose of carbon ions into the carbon layer, at an implant temperature below room temperature, wherein after the directing the dose: the carbon layer exhibits a second stress value, less compressive than the first stress value, and the carbon layer exhibits a second density, greater than the first density.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

In accordance with some embodiments, novel processing techniques entail implantation of carbon-based hardmask layers using low-mass species. In various embodiments, the hardmask layers are formed using a physical vapor deposition (PVD) process, and in particular embodiments the PVD process involves sputtering of a carbon target to deposit a carbon layer. Other physical vapor deposition processes include ion-assisted deposition, ion plating, cathodic arc deposition, and so forth.

Figure 1A:
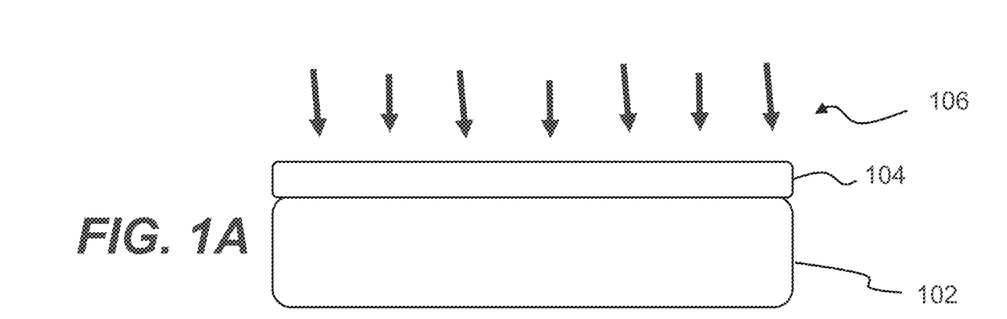
FIG. 1A-1C show exemplary stages of formation of a low stress PVD carbon hardmask layer, according to embodiments of the disclosure.
Figure 1B:
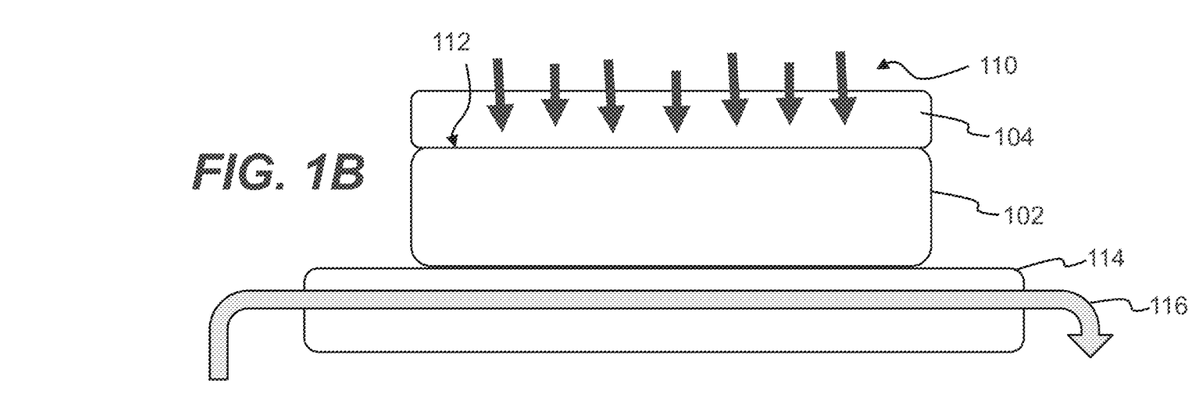
Figure 1C:
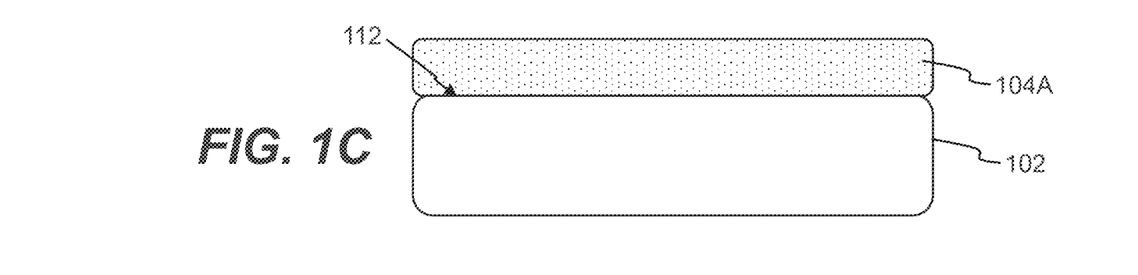

FIG. 1A-1C depict various stages in formation of a low stress hardmask layer, according to embodiments of the disclosure. In FIG. 1A, the operation of depositing a hardmask layer is shown. A hardmask layer 104 is deposited on a substrate 102, where the substrate 102 may represent any suitable substrate, including an unpatterned substrate or a substrate patterned with multiple components and multiple layers. The hardmask layer 104 is formed by condensing PVD species 106. The PVD species 106 may represent any suitable PVD species including sputtered species formed by plasma-based sputtering or ion beam sputtering. Alternatively, the PVD species 106 may be formed by ion assisted deposition or another hybrid technique. The embodiments are not limited in this context. The thickness of the hardmask layer 104 may be chosen for suitability to a particular application. In some examples, the thickness of the hardmask layer 104 (along the Z-axis of the Cartesian coordinate system shown) may be between 50 nm and 200 nm. The embodiments are not limited in this context.

Turning to FIG. 1B there is shown a subsequent operation after the hardmask layer 104 has been fully deposited. In this operation, a dose of low-mass species, such as low-mass ions, is implanted into the hardmask layer 104, as represented by the species 110. According to various embodiments, the hardmask layer may be a carbon-based material, while the low-mass species comprises an atomic weight of 30 amu or less. For example, the species 110 may be a carbon-containing species such as $C^+$, $CH_4^+$ or similar material. The species 110 may be nitrogen, helium, boron, aluminum, phosphorus, silicon, neon or argon ions in other embodiments. In various embodiments, the implanting of species 110 involves using a beamline ion implanter. In other embodiments, the implanting of species 110 may involve use of a plasma-based implant tool, such as a plasma doping (PLAD) tool. The embodiments are not limited in this context. In some embodiments using a beamline ion implanter the ion dose for species 110 may be 5 E16/cm$^2$ or less. In other embodiments using a PLAD tool, the ion dose for species 110 may be 5 E17/cm$^2$ or less.

Figure 2:
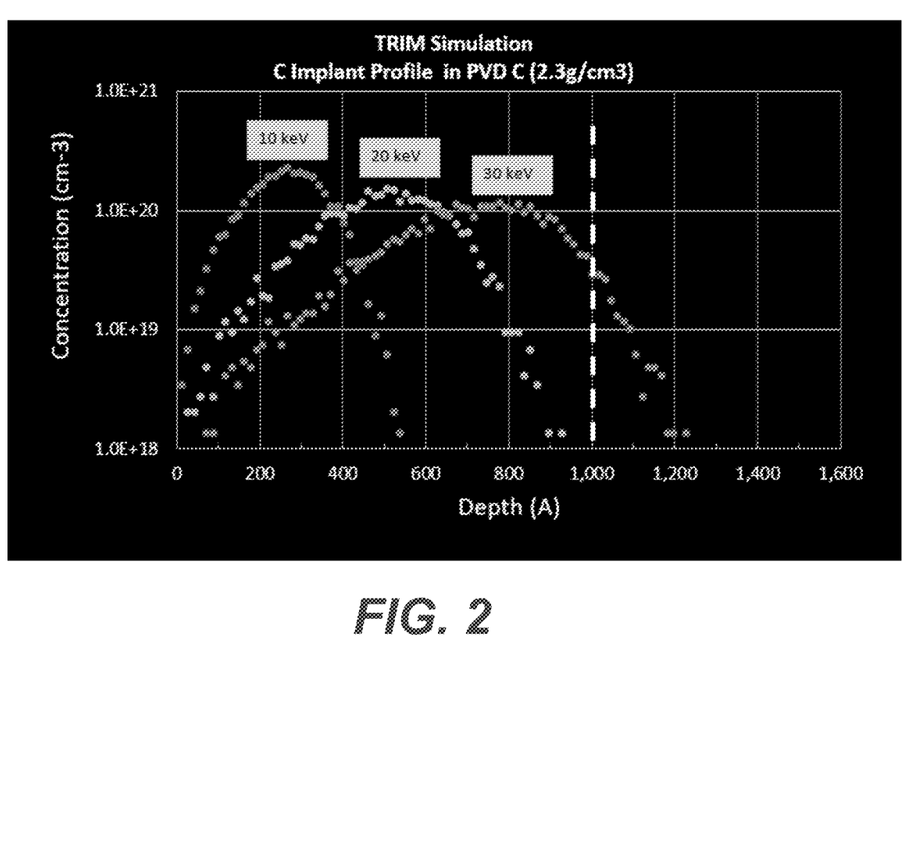
FIG. 2 presents simulation data for carbon implantation into a PVD carbon layer.
Figures 3, 4, 5:
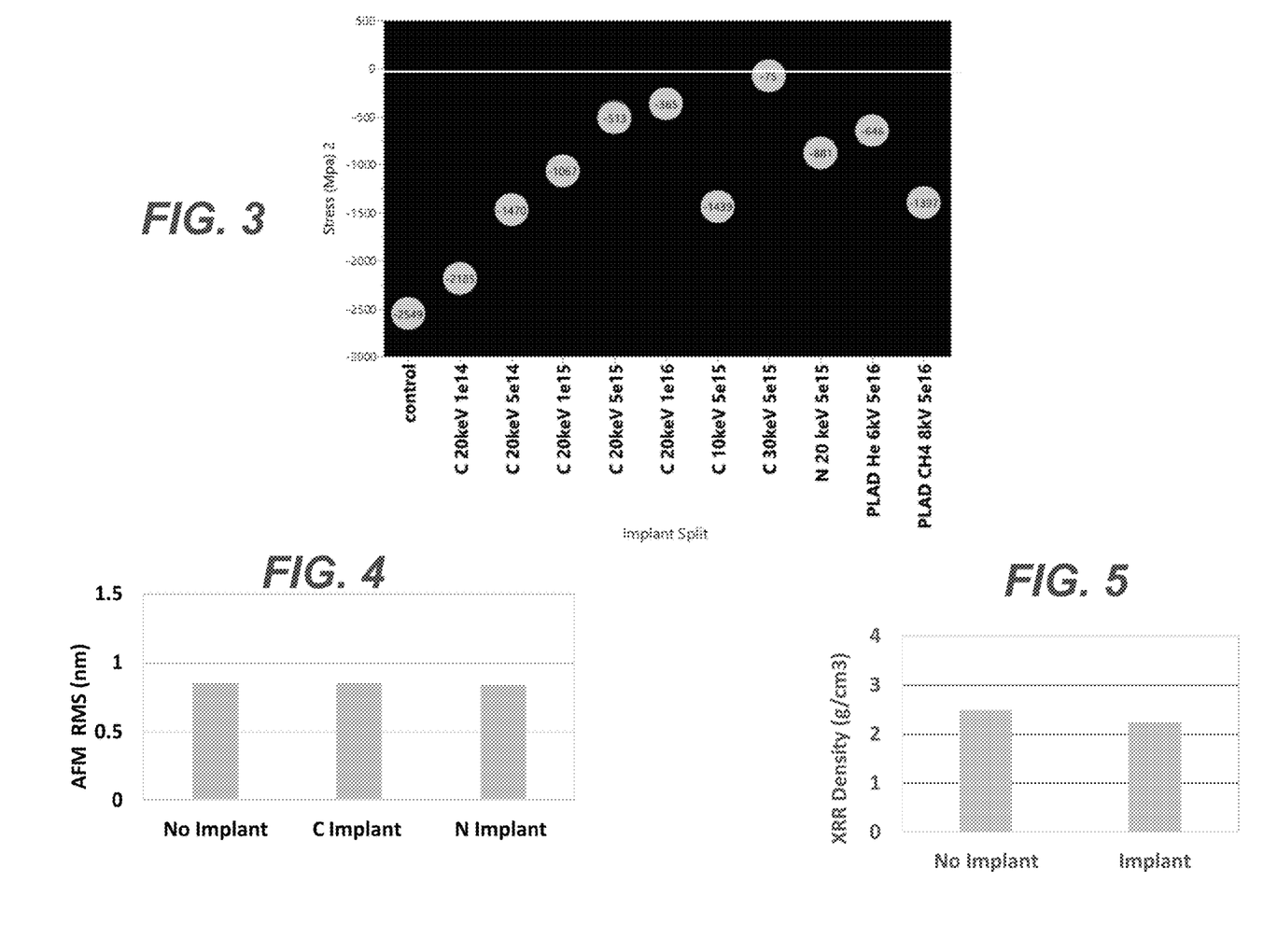
FIG. 3 presents another stress data for PVD carbon layers subject to ion implantation according to further embodiments of the disclosure.
FIG. 4 presents graphs depicting roughness data for PVD carbon layers subject to ion implantation according to some embodiments of the disclosure.
FIG. 5 presents graphs depicting density data for PVD carbon layers subject to ion implantation according to some embodiments of the disclosure.

In accordance with various embodiments of the disclosure, the species 110 may be implanted into the hardmask layer 104, where the species 110 forms an implant profile in the hardmask layer 104, characterized by a peak concentration of species 110 within the hardmask layer 104. For the beamline implant case, the peak in concentration of species 110 may correspond to a depth of 30 percent to 80 percent of the layer thickness of hardmask layer 104. In other words, the peak of concentration of species 110 occurs above the interface 112, between the hardmask 104 and substrate 102. Two examples are shown for beamline C implantation and beamline He implantation in FIG. 3 and FIG. 8B, 8C, respectively. In FIG. 3, the compressive stress is shown to decrease as the C implant energy is increased from 10 to 20 to 30 keV. FIG. 2 shows the lowest stress occurs when the peak of the implant is close to the hardmask and substrate interface. FIG. 8B and FIG. 8C is for beamline He implantation. The stress reduction is more pronounced when the He ion energy is arranged so the peak ion concentration is closer to the interface (7 keV) versus when the peak ion concentration is near the middle of the 80-nm film. In some embodiments, for the PLAD case, the peak in concentration of species 110 may be in the same depth range as for beamline implant, while in other embodiments the peak in concentration may be nearer the surface of the hardmask layer 104. In particular embodiments, the peak in concentration of species 110 may be at a depth of greater than 50 percent of the layer thickness of hardmask layer 104. As discussed below, this arrangement may advantageously reduce stress in the hardmask layer 104, while preserving useful properties of the hardmask layer 104.

As further shown in FIG. 1B, the implanting of species 110 is performed when the substrate 102 is disposed on a platen 114. The platen 114 may be cooled by a coolant 116, where the coolant 116 circulates through the platen or through a stage (not separately shown) thermally coupled to the platen 114. In various embodiments, the coolant 116 may act to establish a substrate temperature of substrate 102 of room temperature (~30 C) or below. In some embodiments, the substrate temperature of substrate 102 may be −100 C. the embodiments are not limited in this context.

As detailed below, the implanting of the species 110 at room temperature or below may reduce the stress of the hardmask layer 104. For example, in accordance with various embodiments, the stress of the hardmask layer 104 may have a first value of 0.5 GPA or greater compressive stress upon completion of deposition of hardmask layer 104. Such a level of stress may be unsuitable for applications where the hardmask layer 104 is to be used for patterning of the substrate 102. One hallmark of many PVD layers, meaning layers formed by a PVD process, is the relatively higher density of such layers. In the case of carbon-based PVD layers, the relatively higher density of the PVD carbon layers as compared to some chemical vapor deposited (CVD) carbon layers, renders the PVD carbon layers as attractive candidates for hardmasks because of the concomitant higher etch resistance associated with the higher density. An issue with PVD carbon layers is the relatively high stress levels often found in the carbon layers as formed. The present embodiments address this issue by providing implantation procedures suitable for generating lower stress levels in PVD layers. In particular examples where the first stress value of a PVD layer is relatively high, such as 0.5 GPa (500 MPa) or greater, the present inventors have discovered approaches to reduce stress to 50% or less of the first stress value. These approaches result in a low stress layer, as represented by the layer 104B in FIG. 1C. In various embodiments PVD layers may be formed exhibiting compressive stress where the stress exhibits a first stress value, while after implantation using a suitable species, dose, and energy, the PVD exhibit a second stress value, less compressive than the first stress value. The term "less compressive" may refer to a circumstance where the second stress is compressive, while the magnitude of compressive stress of the second stress value is less than the magnitude of compressive stress of the first stress value. The term "less compressive" may also refer to a circumstance where the first stress value is a compressive stress value for a layer in a compressive stress state, while the second stress is value is a tensile stress value for a layer in a tensile stress state, and is thus "less compressive" than the compressive stress state.

In accordance with embodiments of the disclosure, low stress layers have been formed in PVD carbon layers having a thickness of 100 nm (1000 Å). According to various embodiments the stress of a layer may be adjusted by adjusting implant energy and ion dose according to the layer thickness. FIG. 2 presents a graph depicting carbon implant depth as a function of ion energy for implantation of 5 E14/cm$^2$ C into a PVD carbon layer. As illustrated, depth profiles for three different implant energies are shown, including 10 keV, 20 keV, and 30 keV. The 10 keV profile exhibits a peak at approximately 38 nm, while the 20 keV profile has a peak at 50 nm, and the 30 keV profile has a peak at 75 nm. In the case of 10 keV and 20 keV, all the implanted species are contained in the carbon layer, while at 30 keV, a few percent of the implanted species are implanted to a depth beyond the nominal 100 nm thickness.

In a series of experiments, a high-density carbon layer was formed by PVD, and subjected to ion implantation to adjust layer properties, including stress. Turning now to FIG. 3, there is shown the results of stress measurements for 100 nm thick PVD carbon layers subject to different room temperature ion implantation treatments. A control sample was deposited by sputtering of a carbon target. While the control sample exhibits a relatively high density, the stress level in the control sample is high, ~2.5 GPa compressive stress (values are listed in MPa). The PVD carbon layers were subject to carbon ion implantation in a beamline ion implanter at energies ranging from 10 keV to 30 keV, and over a dose range up to 1 E16/cm$^2$ (at 20 keV). In other experiments, nitrogen was implanted into the PVD carbon layer using a beamline ion implanter, while in still further experiments, a PLAD tool was used to implant He or CH$_4$ species.

For 20 keV implantation, stress decreases in the carbon layers with increasing ion dose up to 1 E16/cm$^2$. Additionally, at a constant dose of 5 E15/cm$^2$, stress decreases with increasing ion energy from 10 keV to 30 keV. The decrease in stress is more pronounced between 10 keV and 20 keV (~−825 MPa) as opposed to between 20 keV and 30 keV (~450 MPa). By way of comparison, implantation of nitrogen at 5 E15/cm$^2$, 20 keV ion energy also reduced stress to −881 MPa (compressive), somewhat less of an effect than for carbon implantation where stress was reduced to −531 MPa (compressive). In both cases, the first stress value (2.5 GPa) was reduced by 65% or more.

In PLAD experiments, a dose of 5 E16/cm$^2$ was implanted into PVD carbon films at somewhat lower energy. He was implanted at 6 keV, where the resulting stress was −646 MPa, indicating a reduction in compressive stress of nearly 75%. CH$_4$ was implanted at 8 keV, where the resulting stress was −1.34 GPa, a reduction in stress of approximately 45%.

Turning now to FIG. 4, there is shown the results of roughness of PVD carbon layers after implantation of blanket films. The carbon layers were implanted at a dose of 5 E15/cm$^2$ using 30 keV carbon or 20 keV nitrogen. In both implant cases, for both type of PVD carbon layers, the roughness did not increase or exhibited a slight decrease, as shown. Notably, these implant conditions resulted in a large decrease in compressive stress as shown in FIG. 3.

Turning now to FIG. 5, there is shown the results of density measurements of PVD carbon layers after implantation. The carbon layers were implanted at a dose of 5 E15/cm$^2$ using 30 keV carbon. In both implant cases, for both type of PVD carbon layers, the density exhibited a decrease, as shown. Notably, these implant conditions resulted in a large decrease in compressive stress as shown in FIG. 3. The carbon. The carbon layer exhibited an initial density of 2.49 g/cm$^3$ and exhibited a density decrease of −9.6% to 2.25 g/cm3. Notably, this density after implantation may still be suitable for use as an etch resistant hard mask.

Figure 6:
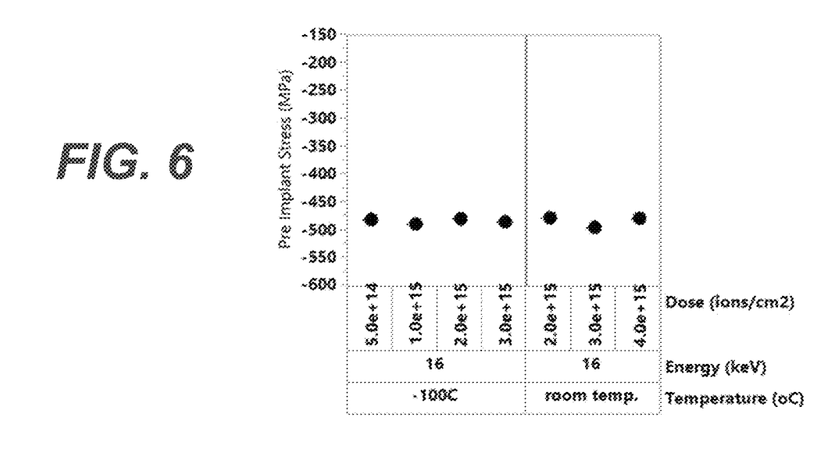
FIGS. 6 and 7 illustrate results of stress measurement, for layers formed according to some embodiments of the disclosure.
Figure 7:
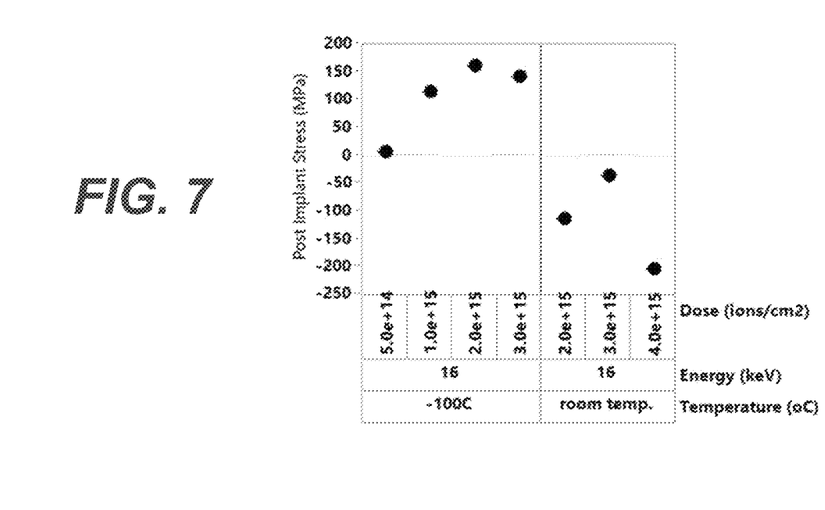

In accordance with embodiments of the disclosure, layer stress of a carbon layer may be reduced by adjusting the deposition conditions of deposition of the carbon layer, as well as adjusting the temperature of implantation of a low-mass species after the deposition. In accordance with additional embodiments of the disclosure, ion implantation of a low-mass species into PVD carbon layers may be carried out at −100° C. FIGS. 6 and 7 illustrate results of stress measurement. FIG. 6 shows actual measurements before implantation plotted for samples subsequently implanted with implant conditions shown, while FIG. 7 shows actual stress after implantation for the different conditions for 800 Å thick carbon layers deposited under conditions of somewhat lower initial compressive stress. As is known, the initial stress of a carbon layer deposited by PVD may be adjusted by changing the deposition conditions. In the examples of FIG. 6 and FIG. 7, the deposition conditions were different than for the carbon samples providing the data for FIGS. 3-5. As a result, the carbon layer initially exhibited a stress of approximately −480 MPa (compressive stress). The carbon layer was then implanted with 16 keV carbon ions in a beamline ion implanter. In one experimental set, the carbon layer was implanted at −100° C., at a dose of 5e14/cm$^2$, resulting in a decrease in compressive stress to approximately zero stress, as shown in FIG. 7. In one experimental set, the carbon layer was implanted at room temperature, at a dose of 2e15/cm$^2$, resulting in a decrease in compressive stress of 364 MPa (+364 MPa). The stress changed from a starting value of −478 MPa to −114 MPa. In another experimental set, the carbon layer was implanted at −100° C., at a dose of 2 E15/cm$^2$, resulting in a shift of stress (+640 MPa), where the resulting carbon layer had a slight tensile stress (~+160 MPa). Accordingly, the implantation at −100° C. was unexpectedly much more effective in reducing the compressive stress in comparison to implantation at room temperature. In another experimental set, the carbon layer was implanted at room temperature with a dose of 3e15/cm$^2$, where the resulting stress change of −458 MPa is similar to the stress change from a much lower dose of 5e14/cm$^2$ carried out at −100° C. (stress change of −487 MPa). FIGS. 6 and 7 show the stress effects from room temperature and −100° C. implants.

Accordingly, implantation at −100° C. into PVD carbon may be similarly more effective in reducing stress as compared to implantation into PVD carbon at room temperature. Notably, the results for implantation at −100° C. reasonably indicate implantation below room temperature at other temperatures, such as −50° C., will also beneficially lower stress more effectively for a given ion dose than implantation at room temperature.

The results of FIG. 6 and FIG. 7 demonstrate even for carbon layers exhibiting relatively lower as-deposited stress (compare 2.5 GPa of FIG. 3 to 0.5 GPa (480 MPa) of FIG. 6), the implantation of carbon may further reduce stress to relatively low levels below 200 MPa. Notably, the conditions for depositing lower stress carbon layers may also result in lower density, where the lower density may impart less etch resistance to hardmasks formed from the carbon layer. As noted above with respect to FIG. 5, the implantation of carbon in the case of 2.5 GPa stress carbon layers may result in lower density, albeit still in an acceptable range for use as a hardmask. The present inventors have discovered an unexpected range of conditions where implantation may improve layer density while at the same time lowering layer stress.

Figure 8A:
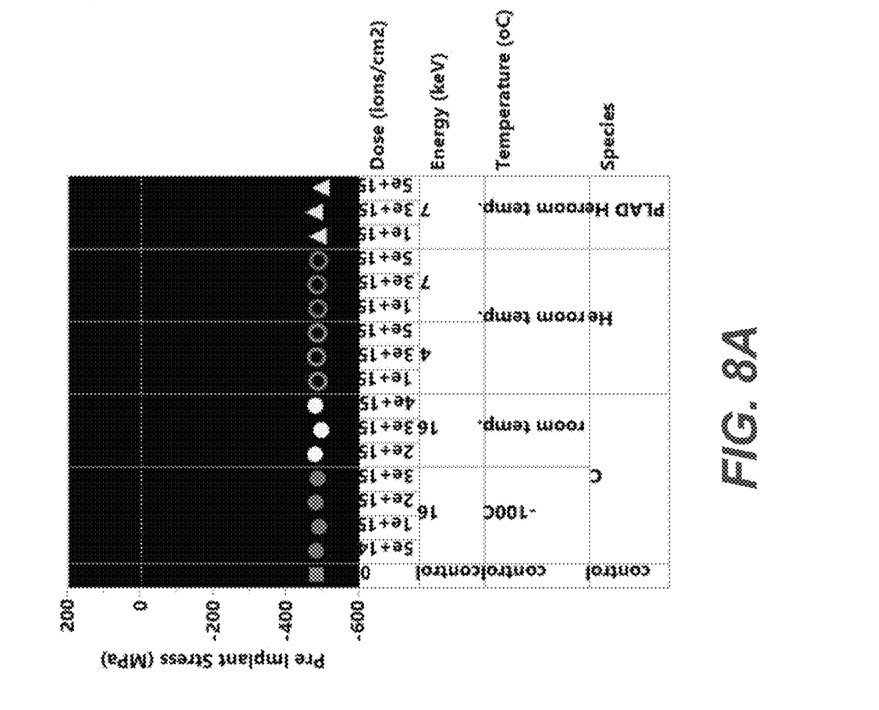
FIG. 8A depicts stress data for PVD carbon layers subject to no ion implantation according to additional embodiments of the disclosure.
Figure 8B:
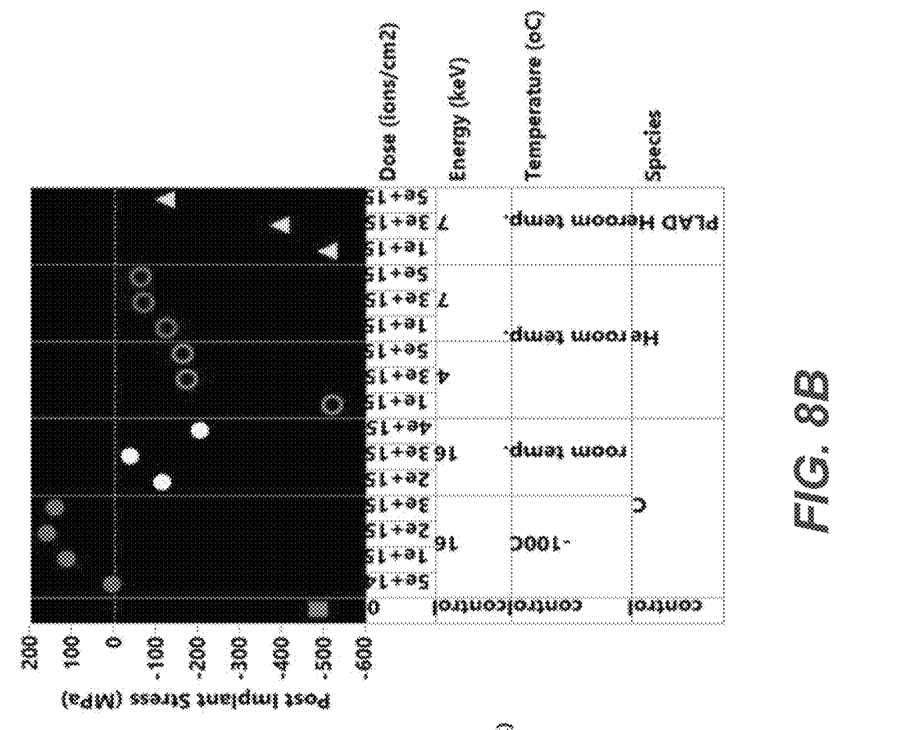
FIG. 8B depicts stress data for PVD carbon layers subject to post ion implantation according to additional embodiments of the disclosure.
Figure 8C:
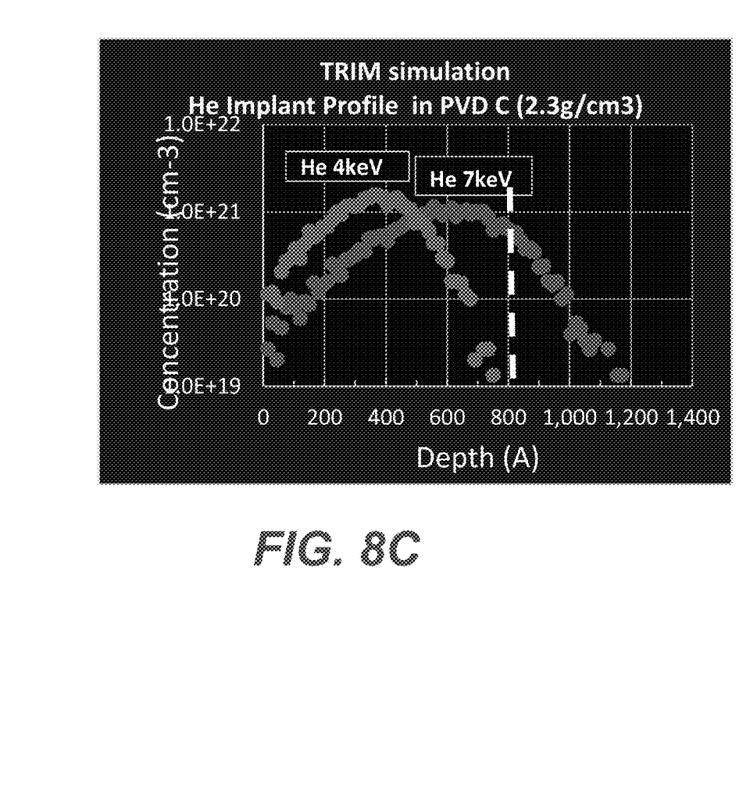
FIG. 8C depicts ion implant simulation of beamline He at two energies.
Figure 8D:
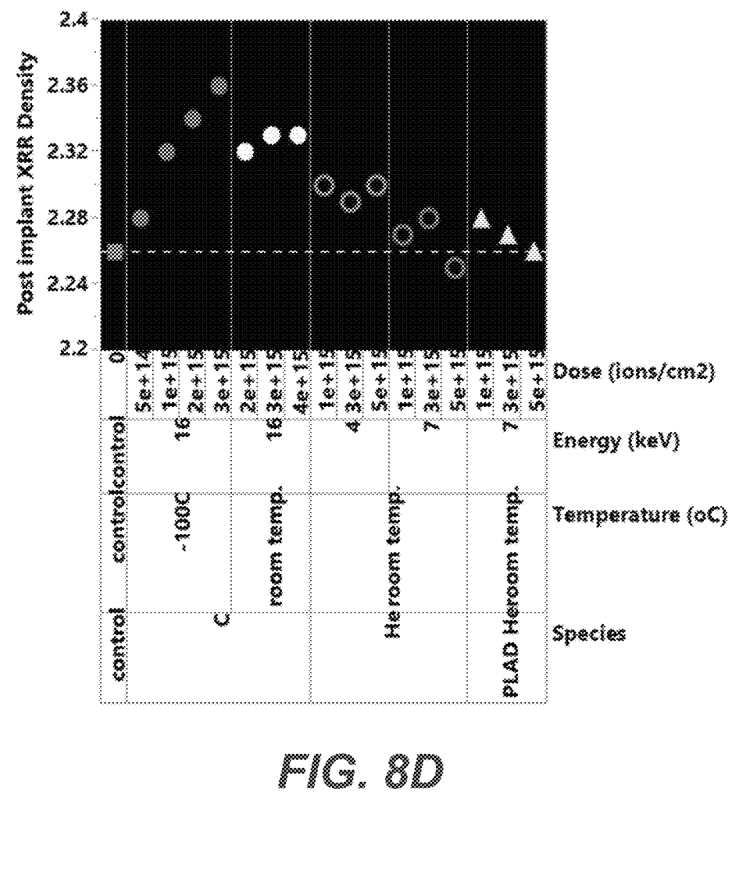
FIG. 8D depicts corresponding density data for PVD carbon layers of FIG. 8B.

FIG. 8A, FIG. 8B and FIG. 8D together present a comparison of stress data and density data for carbon layers implanted under a variety of conditions. FIG. 8A is a graph showing stress data for no ion implantation, according to various additional embodiments of the disclosure, including sample data of FIG. 7. FIG. 8B is a graph showing stress data for implantation of various ions into a carbon layer, according to various additional embodiments of the disclosure, including sample data of FIG. 7. The data includes 16 keV carbon beamline ion implantation (the data shown is for beamline implantation, unless the term "PLAD" is used), as well as 4 keV and 7 keV helium implantation, including beamline implantation, as well as implantation in a PLAD tool. The carbon implantation data includes implantation into layers at −100° C. FIG. 8D shows density data measured by XRR for the same conditions as shown in FIG. 8A. As shown in FIG. 8A, the initial compressive stress of the samples of 480 MPa before exposure to carbon or helium ions is generally reduced by the exposure to carbon or helium. In some cases (−100° C., carbon ions) a slight tensile stress may be imparted into the layers after exposure to the species as shown. Thus, implantation at −100° C. may be useful where a slight tensile stress in a hard mask layer is desirable.

With respect to an unimplanted control sample, the 16 keV carbon ion exposure, as well as 4 keV He ion exposure increases density over the different implant conditions shown. At −100° C., the increase in density is more pronounced than at room temperature (compare 2E15/cm$^2$ and 3E15/cm$^2$ samples). At 7 keV He ion exposure, the effect of layer density is less pronounced. The increase in density for 16 keV carbon implantation contrasts with the decrease in density for carbon layers subject to 30 keV implantation, shown in FIG. 5. Notably, the carbon layers of FIG. 5 were deposited under conditions where the unimplanted layers exhibited high compressive stress (−2500 MPa), while the carbon layers of FIG. 8B and FIG. 8D were deposited under conditions yielding more moderate compressive stress (−500 MPa) before implantation. The layer thickness for data of FIG. 5 was 100 nm, while the layer thickness for data of FIG. 8A and FIG. 8B was 80 nm. Additionally, the implantation energy was reduced by nearly one half from 30 keV to 16 keV. Notably, and with reference to FIG. 2, 16 keV C places the peak in implanted carbon species at approximately the middle of an 800 A (80 nm) thick carbon layer, or 400 A (the peak of 4 keV He implanted into carbon is also at approximately 40 nm), while the 30 keV implantation places the peak in implanted carbon species near the bottom (80 nm depth) of a 100-nm layer. For 16 keV carbon implanted into carbon, the depth corresponding to the peak position plus three times the longitudinal straggle is 80 nm, meaning essentially no implanted carbon will implant into a substrate layer subjacent an 80-nm thick hardmask layer at this energy.

In FIG. 8D the stress reduction is more pronounced when the He ion energy is arranged wherein the peak ion concentration is closer to the interface (7 keV) versus when the peak ion concentration is near the middle of the 80-nm film. FIG. 8C shows the He ion implant simulation showing the He profile for the 4 keV and 7 keV. In sum, the present inventors have unexpectedly found a set of conditions where compressive stress in carbon layers, such as PVD carbon layers may be reduced, while the film density of the carbon layers is improved. Further unexpectedly, the present inventors have discovered t the density of carbon layers may be increased to a greater extent for a given ion dose by implanting the carbon layers at −100° C. as opposed to implanting at room temperature.

In addition to improvements in film density, carbon layers processed in accordance with the present embodiments may also exhibit improved elastic modulus, hardness, and morphology. Table I. exhibits results of various property measurements for carbon films subjected to exposure to carbon or helium species under select conditions, as shown. The properties include N (refractive index), K (extinction coefficient), stress, density, elastic modulus, and fraction of SP$^3$ bonding. The reference samples not subject to implantation were deposited under conditions yielding an initial stress of 483 MPa compressive stress, as discussed above with respect to FIG. 8A. All the samples shown a significant reduction in compressive stress (including yielding tensile stress in some examples), while refractive index, SP$^3$ content, and modulus increased, indicative of more diamond like quality in the layers, after subject to carbon ion or helium ion exposure.

Figure 8E:
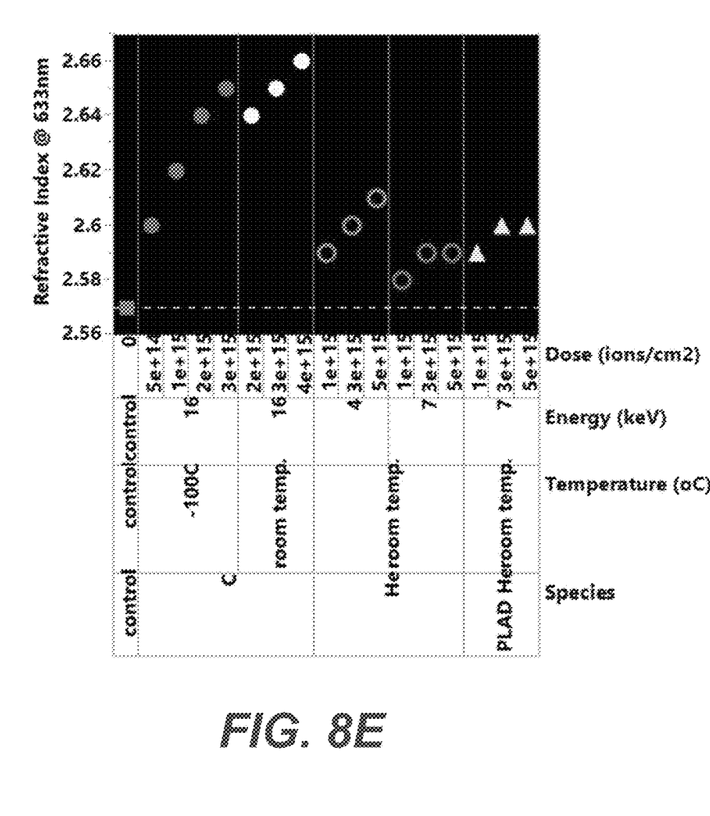
FIG. 8E depicts corresponding refractive index data for PVD carbon layers of FIG. 8B.

FIG. 8E is a graph depicting the refractive index results based upon Table I. Maintaining the refractive index while simultaneously reducing stress is significant. In all implant results, the refractive index is increased, which combination results is significant and useful. The extinction coefficient k is shown to modulate either side of the non-implanted sample 17. The changes are small enough not to be considered significant.

Figure 8F:
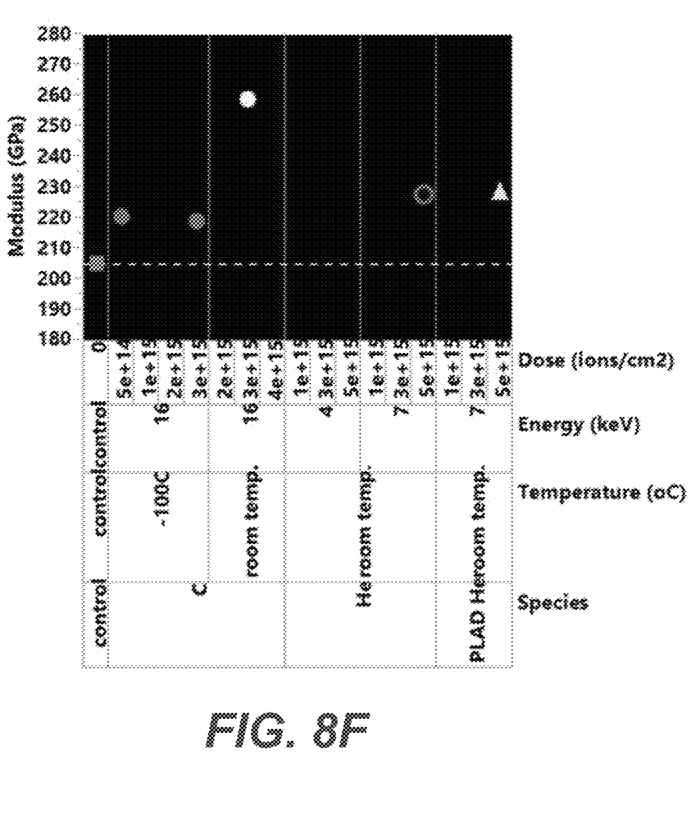
FIG. 8F depicts exemplary modulus data for select PVD carbon layers, subject to ion implantation.

FIG. 8F is a graph depicting the modulus results based upon Table I, showing an increase in elastic modulus in the range of 7-12% for many samples, while one sample (RT, 3E15/cm$^2$ 16 keV Carbon ion implantation) showed an increase of approximately 25%. The ability to reduce film stress while maintaining or increasing elastic modulus is significant. The 25% modulus increase is considered a significant result alone, and when tied with the reduced layer stress provides a very useful enhancement for a combination of layer properties.

TABLE I

| Slot # | beamline/ PLAD | Species | Implant Temp. (° C.) | Energy (keV) | Dose (ions/cm2) | K (@633 nm) | N (@633 nm) | Stress (MPa) | Density (g/cm3) | SP3 (%) | Modulus (GPa) |
|---|---|---|---|---|---|---|---|---|---|---|---|
| 17 | | PVD C reference | | | | 0.61 | 2.57 | −481 | 2.26 | 47.7 | 205 |
| 2 | beamline | C | RT | 16 | 3.00E+15 | 0.64 | 2.65 | −37 | 2.33 | 52.7 | 259 |
| 4 | beamline | C | −100° C. | 16 | 5.00E+14 | 0.60 | 2.6 | 6 | 2.28 | 53.2 | 220 |
| 7 | beamline | C | −100° C. | 16 | 3.00E+15 | 0.58 | 2.65 | 141 | 2.36 | 58 | 219 |
| 13 | beamline | He | RT | 7 | 5.00E+15 | 0.66 | 2.59 | −63 | 2.25 | 47.8 | 228 |
| 14 | PLAD | He | RT | 7 | 5.00E+15 | 0.66 | 2.6 | −121 | 2.26 | 50.9 | 229 |

Figure 8G:
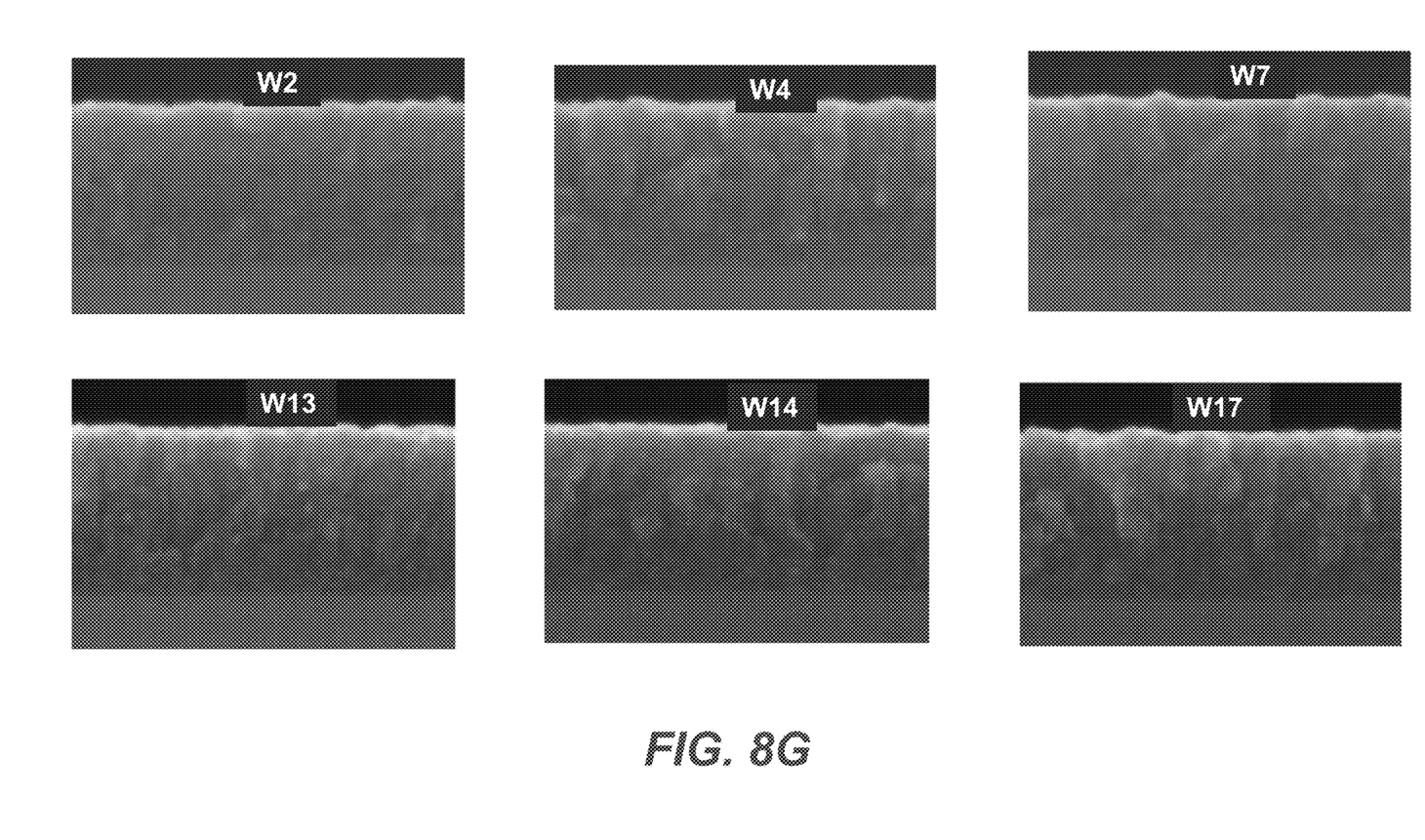
FIG. 8G depicts exemplary electron micrographs for select PVD carbon layers, subject to ion implantation.

FIG. 8G shows a series of electron micrographs depicting the modulus results for the samples of FIG. 8E, where the slot numbers from Table I. are indicated on the individual electron micrographs. As shown, as-deposited carbon layers (W17) exhibit relatively rougher morphology, while the implanted samples exhibit less rough morphology. As an example, the sample W2 ((RT, 3E15/cm$^2$ 16 keV Carbon ion implantation) exhibits substantially smoother morphology and simultaneously reducing stress and improving modulus is a significant result.

In view of the above, in some embodiments, the implant conditions for a hardmask layer may be tailored to locate the peak of an implanting species at a depth corresponding to 30% to 60% of the layer thickness, an in particular embodiments 30% to 50% of the layer thickness, 40% to 60% of the layer thickness, or 45% to 55% of the layer thickness. For these implant conditions, the layer stress of a PVD layer, such as a PVD carbon layer used as a hardmask, may be lowered to an acceptable level while other properties including modulus, refractive index and so forth are improved. In other embodiments, where implantation of species into a subjacent layer below the hard mask is not a concern, the implant conditions may be tailored to place the peak of implanting species at a depth corresponding to 70% to 80% of the layer thickness, as shown by the results for 30 keV C, or 7 keV He, discussed above.

Figure 9:
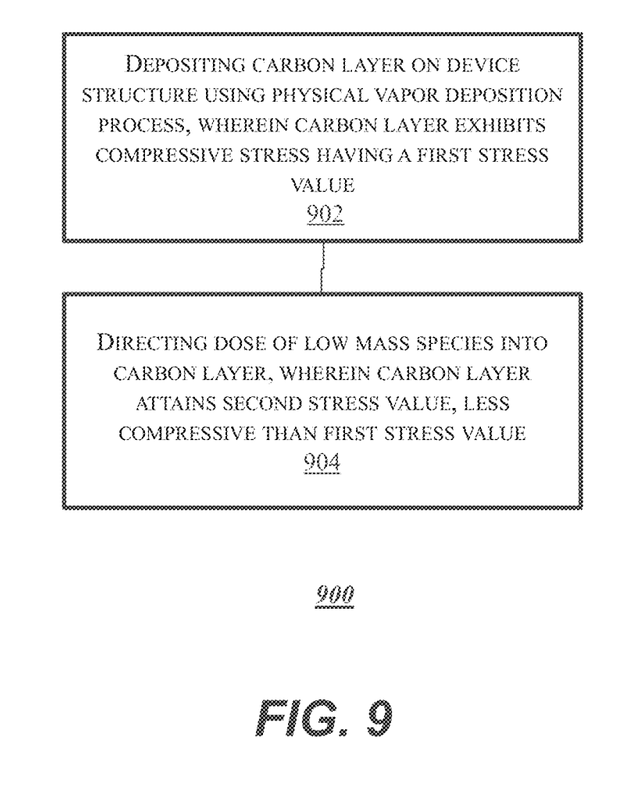
FIG. 9 depicts an exemplary process flow.

Turning now to FIG. 9, there is shown a process flow 900, according to some embodiments of the disclosure. At block 902, the operation is performed of depositing a carbon layer on a device structure using a physical vapor deposition process. Exemplary, non-limiting thickness range for the carbon layer may be between 50 nm and 150 nm. The depositing of the carbon layer may result in generating a compressive stress in the carbon layer. Examples of a level of compressive stress are 400 MPa to 3 GPa. The embodiments are not limited in this context. In some instances, the resultant film density of the carbon layer may be in the range of 2.1 g/cm$^3$ to 2.7 g/cm$^3$. The embodiments are not limited in this context.

At block 904, a dose of low-mass species is directed into the carbon layer. Non-limiting examples of a low-mass species include carbon and helium. The low-mass species may be directed into the carbon layer as ions using a beamline ion implanter or PLAD tool according to some embodiments. A suitable energy for the low-mass species may depend on the thickness of the carbon layer. In various embodiments the ion energy of the low-mass species may be selected to generate a peak in the implanted species profile at a distance equivalent to between 30% and 85% of the thickness of the carbon layer. In various non-limiting embodiments, the ion dose of the low-mass species may range from 1E14/cm$^2$ to 1 E17/cm$^2$. As such, the carbon layer may exhibit a second stress value, less compressive than the first stress value, after the low-mass species are directed into the carbon layer. In some embodiments, the carbon layer may achieve a low compressive stress, such as less than 200 MPa compressive stress, zero stress (meaning less than approximately 50 MPa stress, either tensile or compressive), or a low tensile stress, such as less than 200 MPa tensile stress. Said differently, in these embodiments, the absolute value of the second stress value after exposure to the low mass species may less than 0.2 GPa (200 MPa). In particular embodiments, the density of the carbon layer may increase as a result of the directing of the low-mass species into the carbon layer.

In sum, the present embodiments provide the advantages of the ability to reduce stress in hardmask materials, while preserving acceptable density for use as an etch resistant mask. A further advantage provided by low temperature embodiments (−100° C.) is the ability to reduce stress using much lower ion dose, providing a more commercially practical approach to tailoring hardmask properties. A further advantage of some embodiments is the ability to reduce stress in a hardmask layer, while simultaneously improving (increasing) the refractive index, layer density, SP$^3$ fraction, elastic modulus and improving layer morphology, while potentially increasing etch resistance of such a hardmask layer.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
   depositing a carbon layer on a substrate using physical vapor deposition, wherein the carbon layer exhibits compressive stress, and is characterized by a first stress value between 0.4 GPA and 0.5 GPA; and
   directing a dose of a low-mass species into the carbon layer, wherein, after the directing, the carbon layer exhibits a tensile stress, having a value of between 0 GPa and 0.2 GPa, wherein a density of the carbon layer increases from a first density, before the directing the dose, to a second density, after the directing the dose.

2. The method of claim 1, wherein the directing the dose comprises cooling the substrate to a substrate temperature, the substrate temperature being −50° C. or cooler and implanting the low-mass species into the carbon layer when the substrate is at the substrate temperature.

3. The method of claim 1, wherein the low-mass species is a carbon-containing species, nitrogen, or helium.

4. The method of claim 1, wherein the directing the dose comprises using a beamline ion implanter to implant the dose, and wherein the dose comprises an ion dose of 5 E14/cm$^2$ to 5 E15/cm$^2$.

5. The method of claim 1, wherein the directing the dose comprises using a plasma doping tool to implant the dose, and wherein the dose comprises an ion dose of 5 E14/cm$^2$, to 5 E15/cm$^2$.

6. The method of claim 1, wherein the directing the dose comprises cooling the substrate to −100° C. or cooler during the implanting.

7. The method of claim 1, wherein the first density is approximately 2.26 g/cm$^3$, before the directing the dose.

8. The method of claim 1, wherein the carbon layer comprises a layer thickness, and wherein the low-mass species comprises an implant profile in the carbon layer, wherein a peak concentration of the low-mass species in the carbon layer corresponds to a depth of 30 percent to 80 percent of the layer thickness.

9. A method to generate a low stress etch resistant mask layer, comprising:

depositing a carbon layer by physical vapor deposition, wherein the carbon layer exhibits a compressive stress, wherein a value of the compressive stress is a first stress value, between 0.4 GPA and 0.5 GPA, and wherein the carbon layer exhibits a first density; and directing a dose of low-mass ions into the carbon layer, wherein after the directing the dose:

the carbon layer exhibits a tensile stress, having a value of between 0 GPa and 0.2 GPa wherein the carbon layer exhibits a second density, greater than the first density, and wherein the directing the dose comprises cooling the substrate to a substrate temperature, the substrate temperature being in a range of −50° C. or cooler, and implanting the low-mass species into the carbon layer when the substrate is at the substrate temperature.

10. The method of claim 9, wherein the first stress value is 1 GPa or less.

11. The method of claim 9, wherein the low-mass ions comprise carbon ions.

12. The method of claim 9, wherein the dose of low-mass ions comprises an ion dose of 5 E14/cm$^2$ to 5 E15/cm$^2$.

13. A method to generate a low stress etch resistant mask layer, comprising:

depositing a carbon layer by physical vapor deposition, wherein the carbon layer exhibits a compressive stress, wherein a value of the compressive stress is a first stress value, between 0.4 GPA and 0.5 GPA, and wherein the carbon layer exhibits a first density; and directing a dose of carbon ions into the carbon layer, at an implant temperature below room temperature, wherein after the directing the dose:

the carbon layer exhibits a tensile stress, having a value of between 0 GPa and 0.2 GPa, and the carbon layer exhibits a second density, greater than the first density, wherein the directing the dose comprises cooling the substrate to a substrate temperature, the substrate temperature being −50° C. or cooler and implanting the low-mass species into the carbon layer when the substrate is at the substrate temperature.

14. The method of claim 13, wherein a peak of the carbon ions is located in a middle of the carbon layer.

15. The method of claim 13, wherein the dose comprises an implant dose of 5 e14/cm$^2$ to 5E 15/cm$^2$.

16. The method of claim 15, wherein the carbon layer comprises a film thickness, the film thickness being in a range of 50 nm to 200 nm.

* * * * *

UNITED STATES PATENT AND TRADEMARK OFFICE
CERTIFICATE OF CORRECTION

| | |
|---|---|
| PATENT NO. | : 10,811,257 B2 |
| APPLICATION NO. | : 15/997251 |
| DATED | : October 20, 2020 |
| INVENTOR(S) | : Rajesh Prasad et al. |

It is certified that error appears in the above-identified patent and that said Letters Patent is hereby corrected as shown below:

On the Title Page

Item (72), Line 7:
Please replace Viabhav Soni with -- Vaibhav Soni --

Signed and Sealed this
Third Day of September, 2024

Katherine Kelly Vidal
*Director of the United States Patent and Trademark Office*